United States Patent
Adelmann et al.

(10) Patent No.: US 9,437,817 B2
(45) Date of Patent: Sep. 6, 2016

(54) INSULATOR MATERIAL FOR USE IN RRAM

(71) Applicant: IMEC, Leuven (BE)

(72) Inventors: Christoph Adelmann, Wilsele (BE); Malgorzata Jurczak, Leuven (BE)

(73) Assignee: IMEC, Leuven (BE)

( * ) Notice: Subject to any disclaimer, the term of this patent is extended or adjusted under 35 U.S.C. 154(b) by 5 days.

(21) Appl. No.: 13/959,553

(22) Filed: Aug. 5, 2013

(65) Prior Publication Data

US 2014/0034894 A1 Feb. 6, 2014

(30) Foreign Application Priority Data

Aug. 6, 2012 (EP) .................................. 12179378

(51) Int. Cl.
| | |
|---|---|
| *H01L 45/00* | (2006.01) |
| *C08K 3/08* | (2006.01) |
| *C08K 3/04* | (2006.01) |
| *C23C 16/32* | (2006.01) |
| *C23C 16/40* | (2006.01) |
| *C23C 16/455* | (2006.01) |

(52) U.S. Cl.
CPC ............... *H01L 45/147* (2013.01); *C08K 3/04* (2013.01); *C08K 3/08* (2013.01); *C23C 16/32* (2013.01); *C23C 16/40* (2013.01); *C23C 16/45529* (2013.01); *C23C 16/45531* (2013.01)

(58) Field of Classification Search
None
See application file for complete search history.

(56) References Cited

U.S. PATENT DOCUMENTS

| | | | |
|---|---|---|---|
| 7,364,965 B2 | 4/2008 | Tonomura et al. | |
| 7,592,251 B2 | 9/2009 | Ahn et al. | |
| 2003/0227033 A1 | 12/2003 | Ahn et al. | |
| 2005/0202222 A1* | 9/2005 | Cartier ................... | C01G 27/02 428/209 |
| 2005/0227003 A1 | 10/2005 | Carlson | |
| 2005/0271813 A1 | 12/2005 | Kher et al. | |
| 2010/0187644 A1 | 7/2010 | Nabatame | |
| 2010/0258782 A1 | 10/2010 | Kuse et al. | |
| 2011/0156123 A1 | 6/2011 | Fumitake | |
| 2011/0220861 A1 | 9/2011 | Himeno et al. | |
| 2011/0227028 A1 | 9/2011 | Sekar et al. | |
| 2011/0263115 A1 | 10/2011 | Ganguli et al. | |

(Continued)

FOREIGN PATENT DOCUMENTS

WO WO2010/118380 A2 10/2010

OTHER PUBLICATIONS

Lee, Heng-Yuan et al., "Low-Power Switching of Nonvolatile Resistive Memory Using Hafnium Oxide", Japanese Journal of Applied Physics, vol. 46, No. 4B, Apr. 24, 2007, pp. 2175-2179.

(Continued)

*Primary Examiner* — Andres Munoz
(74) *Attorney, Agent, or Firm* — McDonnell Boehnen Hulbert & Berghoff LLP (57) ABSTRACT

The present disclosure relates generally to Hf-comprising materials for use in, for example, the insulator of a RRAM device, and to methods for making such materials. In one aspect, the disclosure provides a method for the manufacture of a layer of material over a substrate, said method including
a) providing a substrate, and
b) depositing a layer of material on said substrate via ALD at a temperature of from 250 to 500° C., said depositing step comprising:
at least one $HfX_4$ pulse, and
at least one trimethyl-aluminum (TMA) pulse,
wherein X is a halogen selected from Cl, Br, I and F and is preferably Cl.

13 Claims, 8 Drawing Sheets

(56) References Cited

U.S. PATENT DOCUMENTS

2011/0263137 A1    10/2011    Mahajani
2011/0269267 A1    11/2011    Fuchigami et al.

OTHER PUBLICATIONS

Chen, Pang Shiu et al., "HfOx Thin Films for Resistive Memory Device by Use of Atomic Layer Deposition", Mater. Res. Soc. Symp. Proc., vol. 997, 2007 Materials Research Society, 7 pages.

Yu, Shimeng et al., "Characterization of Switching Parameters and Multilevel Capability in HfOx/AlOx Bi-Layer RRAM Devices", 2011 International Symposium on VLSI Technology, Systems and Applications (VLSI-TSA), Apr. 25-27, 2011, pp. 1-2.

Baik, Hion Suck et al., "Interface Structure and Non-Stoichiometry in HfO2 Dielectrics", Applied Physics Letters, vol. 85, No. 4, Jul. 26, 2004, pp. 672-674.

Ganem, J.J. et al., "Study of Thin Hafnium Oxides Deposited by Atomic Layer Deposition", Nuclear Instruments and Methods in Physics Research, B 219-220, 2004, pp. 856-861.

* cited by examiner

INSULATOR MATERIAL FOR USE IN RRAM

CROSS-REFERENCE TO RELATED APPLICATIONS

This application claims the benefit of priority of European pat. app. no. 12179378.0 filed on Aug. 6, 2012, which is hereby incorporated herein by reference in its entirety.

TECHNICAL FIELD

The present disclosure relates to a Hf-comprising material for use in the insulator of a RRAM device.

BACKGROUND ART

Resistive random-access memory (RRAM) is a non-volatile memory type under development. RRAM has recently gained much interest as a potential replacement for FLASH memory.

The basic idea is that a dielectric, which is normally insulating, can be made to conduct through a filament or conduction path formed after application of a sufficiently high voltage. The conduction path formation can arise from different mechanisms, including defects, metal migration, etc. Once the filament is formed, it may be reset (broken, resulting in high resistance) or set (re-formed, resulting in lower resistance) by an appropriately applied voltage.

At the basis of RRAM is a metal-insulator-metal (MIM) stack. $HfO_2$ has been of great interest as the insulator in the MIM stack. However, a better performance has been demonstrated by not only using $HfO_2$ as the insulator but by using a bi-layer of a stoichiometric $HfO_2$ layer and a non-stoichiometric O-deficient HfOx (x<2) layer. For $HfO_2$, the commonly accepted mechanism of filament creation and destruction occurs by the diffusion of oxygen vacancies. Oxygen vacancies lead to defect states in the $HfO_2$ dielectric; if a large number of oxygen vacancies are present (locally), the $HfO_2$ dielectric becomes conductive. In such a bilayer stack, the non-stoichiometric O-deficient HfOx (x<2) layer can act as a sink for oxygen. So far, this O-deficient HfOx layer has always been deposited by PVD but for integration, it would be of great interest to deposit the layer by ALD, which is more manufacturing friendly and which is the method typically used for $HfO_2$ deposition. A general description of ALD is disclosed in [0004] to [0009] of US2005/0227003. So far, an ALD process for HfOx with x<2 has been elusive since no stable phase other than $HfO_2$ exists in the Hf—O phase diagram and the deposition of suboxides by ALD is generally difficult. There is therefore a need in the art for an alternative material which can be deposited by ALD.

SUMMARY OF THE DISCLOSURE

In certain aspects, the present disclosure provides an alternative to the PVD deposited O-deficient HfOx material, which can be deposited by ALD. This aspect can be achieved according to the disclosure with the materials as described herein.

In other aspects, the present disclosure provides a method for forming said material on a substrate. This aspect can be achieved according to the disclosure with the methods as described herein.

Herein is disclosed an ALD method leading to the fabrication of materials and in particular oxygen-deficient materials that can be used in combination with a $HfO_2$ layer to form the insulator of a MIM stack, advantageous for use in RRAM applications.

In a first aspect, the present disclosure relates to a method for the manufacture of a layer of material over a substrate, said method comprising
  a) providing a substrate, and
  b) depositing a layer of material on said substrate via ALD at a temperature of from 250 to 500° C., said depositing step comprising:
    at least one $HfX_4$ pulse, and
    at least one trimethyl-aluminum (TMA) pulse,
    wherein X is a halogen selected from Cl, Br, I and F and is preferably Cl.

In an embodiment, said $HfX_4$ pulse may be performed before said TMA pulse.

In an embodiment, the method may further comprise at least one oxidizer (Ox) pulse.

In an embodiment, said oxidizer pulse may be selected from $H_2O$ and $O_3$ pulses.

In an embodiment, said depositing step may comprise any one of the following sequence of pulses:
  $HfX_4$/TMA/optionally repeated one or more times, or
  $HfX_4$/TMA/Ox/optionally repeated one or more times, or
  $HfX_4$/Ox/TMA/optionally repeated one or more times.

In an embodiment, said depositing step may comprise any one of the following sequence of pulses or a combination thereof:
  $(HfX_4/TMA/)_{n1}(HfX_4/Ox/)_{m1}$, or
  $(HfX_4/TMA/Ox/)_{n2}(HfX_4/Ox/)_{m2}$, or
  $(HfX_4/Ox/TMA/)_{n3}(HfX_4)Ox/)_{m3}$.
Wherein n1 is from 1 to 300, preferably from 1 to 50 and more preferably from 1 to 15,
Wherein n2 is from 1 to 500, preferably from 1 to 50 and more preferably from 1 to 15,
Wherein n3 is from 1 to 500, preferably from 1 to 50 and more preferably from 1 to 15,
Wherein m1, m2 and m3 are from 0 to 100, preferably from 0 to 30.

In embodiments where the deposition step comprises a combination of two or more of the above sequences, the sum of all n1, n2, n3, m1, m2, and m3 is preferably not more than 1000. As an example, for the following sequence $\{[(HfX_4/TMA/)_{10}(HfX_4/Ox/)_5]_2(HfX_4/Ox/TMA/)_3\}_5$, said sum would amount to $((10+5)*2+3)*5=165$ which is not more than 1000.

The notation A/B/ is shorthand for A pulse-purge-B pulse-purge.

Purging may involve a variety of techniques including, but not limited to, contacting the substrate and/or monolayer with an inert gas and/or lowering pressure to below the deposition pressure to reduce the concentration of a species contacting the substrate and/or chemisorbed species. Examples of inert gases include $N_2$, Ar, He, Ne, Kr, Xe, etc. Purging may instead include contacting the substrate and/or monolayer with any substance that allows chemisorption by-products to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

Preferably, $N_2$ is used for purging.

In embodiments, the method may further comprise the step of providing a HfO$_2$ layer directly above or below said layer of material.

In embodiments, said HfO$_2$ layer may be provided by a sequence of p cycles of the sequence HfX$_4$/Ox/.

In an embodiment, said depositing step may comprise any one of the following sequence of pulses or a combination thereof:

(HfX$_4$/TMA/)$_{n1}$(HfX$_4$/Ox/)$_{m1}$, or
(HfX$_4$/TMA/Ox/)$_{n2}$(HfX$_4$/Ox/)$_{m2}$, or
(HfX$_4$/Ox/TMA/)$_{n3}$(HfX$_4$/Ox/)$_{m3}$.

followed (or preceded) by the provision of a HfO$_2$ layer via the following sequence of pulses (HfX$_4$/Ox/)$_p$, wherein p is from 1 to 100 and preferably from 1 to 30.

In embodiments, X may be Cl.

In embodiments, said temperature may be from 300 to 400° C., preferably from 340 to 380° C., more preferably from 340 to 370° C. This is advantageous because higher temperature introduces a disadvantageous CVD component in the TMA ALD process and because lower temperature provide inexistent or negligible layer formation. In an embodiment, said temperature is the temperature of the substrate.

In an embodiment, the thickness of said layer of material may be from 0.3 to 100 nm.

In a second aspect, the present disclosure relates to a material comprising the elements Hf, Al and optionally C and/or O and/or X, wherein said material comprises at least the element C or O, wherein X is selected from Cl, Br, I and F (preferably Cl), wherein said elements makes up at least 90% of the at % (i.e., atomic percent) composition of the material as determined by XPS (and therefore ignoring the hydrogen content), wherein Hf represents from 17 to 40 at % of said elements (i.e. Hf, Al, C, O and X), Al represents from 5 to 23 at % of said elements, C represents from 0 to 45 at % of said elements, O represents from 0 to 62% of said elements, X represents from 0 to 10 at % of said elements, the sum of said elements amounting to 100 at %. In an embodiment, said elements Hf, Al and optionally C and/or O and/or X may make up at least 93%, preferably at least 96% and most preferably at least 99% of the at % composition of the material as determined by XPS.

These proportions in Hf, Al, C, O and X can be tuned by varying the proportion of sequences comprising an oxidative pulse. A higher proportion of sequences comprising an oxidative pulse leads to a lower Hf content, a lower C content, a higher Al content, a higher O content, and a lower X content.

It is worth noting that XPS analysis does not determine the hydrogen content of a sample. Of course, other elements than Hf, Al, C, O and X can be present in the composition as determined by XPS as long as they are not present in such an amount as to diminish the proportion represented by Hf, Al, C, O and X below 90%, preferably below 93%, more preferably below 96% and most preferably below 99% of the at % composition of the material as determined by XPS.

In embodiments, said material comprising the elements Hf, Al and optionally C and/or O and/or X, wherein said material comprises at least the element C or O, may further comprise from 0 to 20 at % of hydrogen as determined by Time-of-Flight Elastic Recoil detection analysis (TOF-ERDA). This value can be tuned by varying the proportion of sequences comprising an oxidative pulse. A higher proportion of sequences comprising an oxidative pulse leads to a lower hydrogen content.

In embodiments of the second aspect, the band gap of the material may be anywhere from 0 to about 6.5 eV. This value can be tuned by varying the proportion of sequences comprising an oxidative pulse. A higher proportion of sequences comprising an oxidative pulse leads to a larger band gap.

The material of the second aspect may be produced by the method of the first aspect.

In a first embodiment of the second aspect,
Hf may represent from 29 to 40 at % of said elements Hf, Al, C, O and X as measured by XPS,
Al may represent from 5 to 15 at % of said elements Hf, Al, C, O and X as measured by XPS;
C may represent from 31 to 45 at % of said elements Hf, Al, C, O and X as measured by XPS;
O may represent from 0 to 14 at % of said elements Hf, Al, C, O and X as measured by XPS;
X may represent from 0 to 10 at % of said elements Hf, Al, C, O and X as measured by XPS,
the sum of said elements amounting to 100 at %, In this first embodiment, said material may further comprise from 5 to 20 at % of hydrogen as determined by Time-of-Flight Elastic Recoil detection analysis (TOF-ERDA).

For instance, the first embodiment of the second aspect of the present disclosure may relate to a material comprising the elements Hf, C, Al, O and X, wherein said elements make up at least 90% (preferably at least 94, more preferably at least 96 and most preferably at least 99%) of the at % composition of the material as determined by XPS, wherein Hf represents from 34 to 40 at % of said elements (i.e. of Hf, C, Al, O and X), C represents from 36 to 45 at % and preferably 40 to 45 at % of said elements, Al represents from 9 to 14 at % of said elements, O represents from 0 to 9 at % and preferably from 0 to 6 at % of said elements and X represents 2 to 9 at % and preferably from 2 to 6 at % of said elements, the sum of said at % of said elements amounting to 100 at %, wherein X is a halogen selected from Cl, Br, I and F and is preferably Cl.

In the first embodiment of the second aspect, said material may be electrically conductive (i.e. behaving as a metal).

The material of the first embodiment of the second aspect may be produced by the method of the first aspect wherein no oxidizer pulse is used, i.e. wherein the sequence of pulse is (HfX$_4$/TMA)$_{n1}$.

In a second embodiment of the second aspect,
Hf may represent from 17 to 23 at % of said elements Hf, Al, C, O and X as measured by XPS;
Al may represent from 16 to 23 at % of said elements Hf, Al, C, O and X as measured by XPS;
O may represent 57 to 62 at % of said elements Hf, Al, C, O and X as measured by XPS;
C may represent from 0 to 3 at % of said elements Hf, Al, C, O and X as measured by XPS;
X may represent from 0 to 1% of said elements Hf, Al, C, O and X as measured by XPS;
the sum of said at % of said elements amounting to 100 at %.

The material of the second embodiment of the second aspect may be produced by the method of the first aspect wherein an oxidizer pulse is used in each sequence, e.g. wherein the sequence of pulse is (HfX$_4$/TMA/Ox)n$_2$ or (HfX$_4$/Ox/TMA)n$_3$.

In embodiments, said material of the second embodiment of the second aspect may further comprise from 0 to 5 at % of hydrogen as determined by Time-of-Flight Elastic Recoil detection analysis (TOF-ERDA).

In a third aspect, the present disclosure relates to a material obtainable by the method according to any one embodiment of the first aspect.

In a fourth aspect, the present disclosure relates to a device comprising a metal-insulator-metal stack, said stack comprising:

A first metal layer,
A layer of material according to any embodiment of the second or third aspect,
A $HfO_2$ layer, and
A second metal layer.

In a further aspect, the present disclosure relates to a memory device comprising a metal-insulator-metal stack of layers, wherein said insulator comprises a layer of material according to any one of the second, third or fourth aspect.

In an embodiment, said memory device may be a resistive RAM

BRIEF DESCRIPTION OF THE DRAWINGS

The disclosure will be further elucidated by means of the following description and the appended figures.

DETAILED DESCRIPTION OF PREFERRED EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

EXAMPLES

All depositing steps have been performed in an ASM Pulsar® 3000 connected to a Polygon 8300.

The substrates were 300 mm Si (100) wafers having a 10 nm SiO2 top layer grown by rapid thermal oxidation.

The precursor $HfCl_3$ was purchased from ATMI and used as such.

Example 1

HfC Process

Adequate pulse length will vary in function of the used experimental set up, the optimal pulse length for the present experimental set up was therefore determined experimentally.

Figure 1:
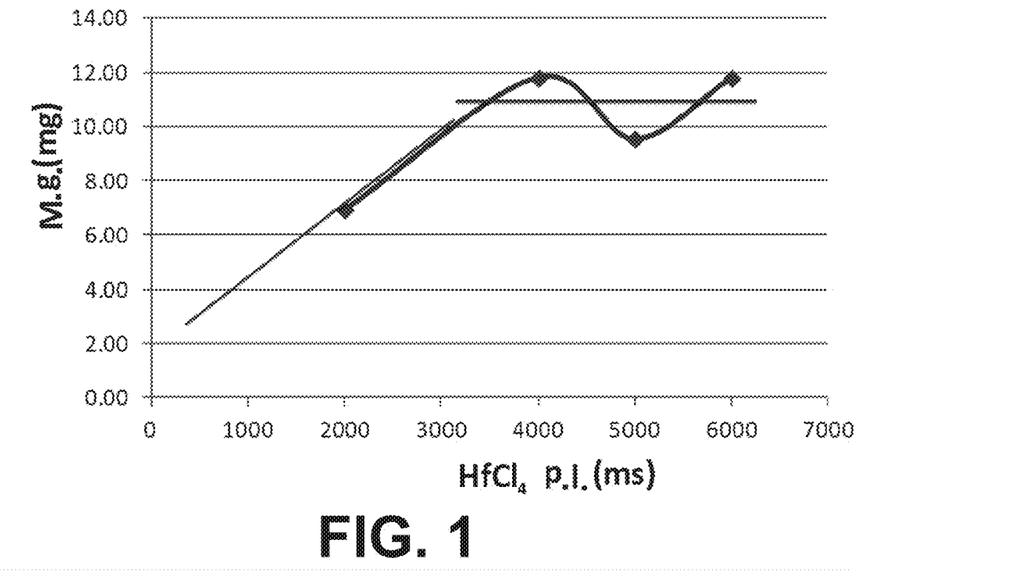
FIG. 1 is a graph showing the mass gain of the substrate (a 300 mm wafer) after 100 full $HfCl_4$/TMA cycles for a 4 s TMA pulse in function of the $HfCl_4$ pulse length according to an embodiment of the present disclosure.

First, mass gain (mg) on the substrate at 370° C. was measured in function of $HfCl_4$ pulse length (ms) (FIG. 1). It was observed that mass gain saturates at 11 mg for pulse lengths of 3 s or above.

Figure 2:
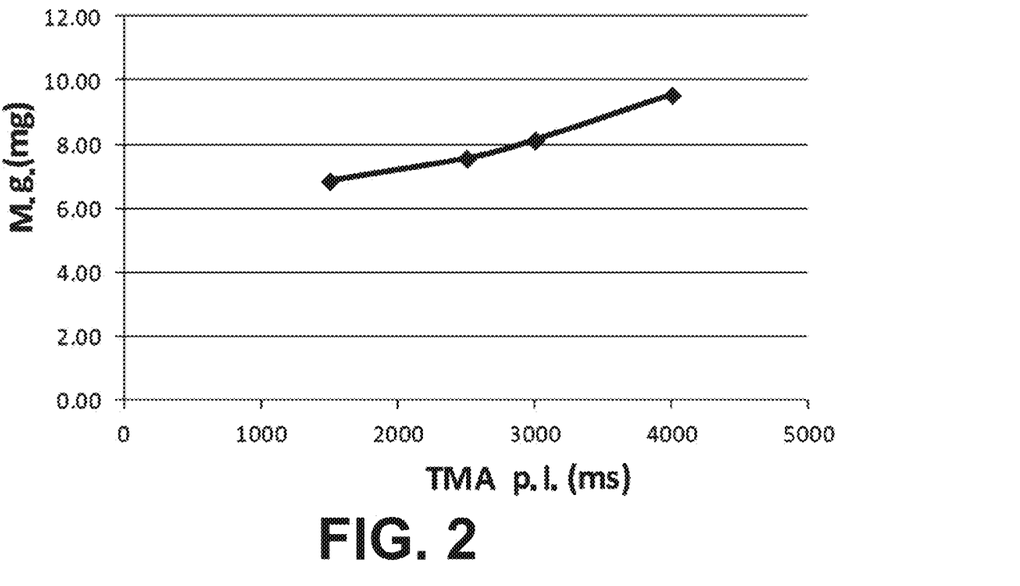
FIG. 2 is a graph showing the mass gain of the substrate (a 300 mm wafer) after 100 full $HfCl_4$/TMA cycles for a 3 s HfCl4 pulse in function of the TMA pulse length according to an embodiment of the present disclosure.

Second, mass gain (mg) on the substrate at 370° C. was measured in function of TMA pulse length (ms) (FIG. 2). It was observed that mass gain increases slowly with TMA pulse length. This was indicative of a small CVD component. Such CVD components get more dominant at higher temperature and are not favourable for ALD. This indicates that it is less advantageous to operate with a substrate above 370° C.

It is advantageous for the HFC material to be a bad dielectric or a metal. Sheet resistance and sheet resistance uniformity has therefore been measured for various $HfCl_4$ pulse lengths while keeping the TMA pulse at 3 seconds. The following pulse sequence was therefore performed on a substrate at 370° C.: $HfCl_4$ (2-5 s)/$N_2$ purge/TMA (3 s)/$N_2$ purge. A shorthand description of this same sequence is $HfCl_4$ (2-5 s)/TMA (3 s).

Figure 3:
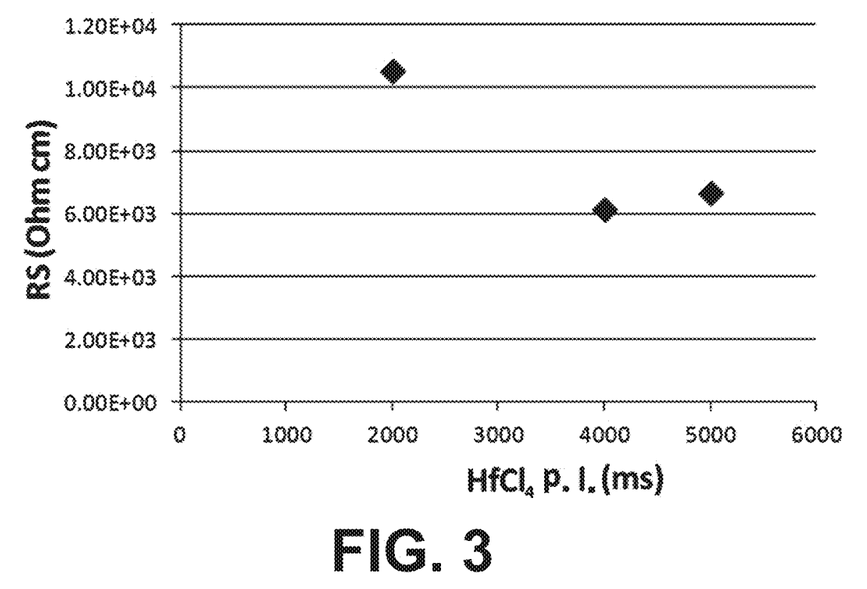
FIG. 3 is a graph showing the evolution of the sheet resistance after 100 full $HfCl_4$/TMA cycles for a 3 sec TMA pulse length in function of the $HfCl_4$ pulse length according to an embodiment of the present disclosure.
Figure 4:
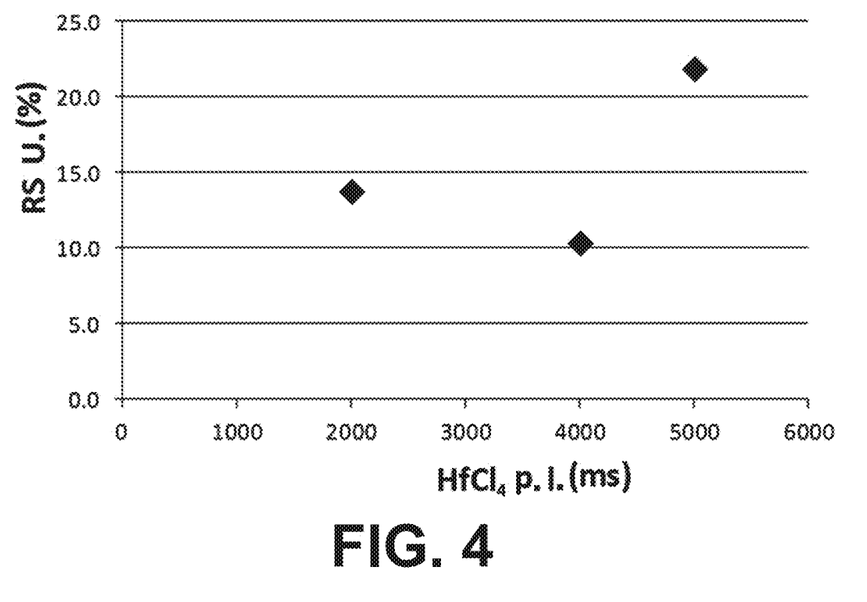
FIG. 4 is a graph showing the evolution of the sheet resistance uniformity after 100 full $HfCl_4$/TMA cycles for a 3 sec TMA pulse length in function of the $HfCl_4$ pulse length according to an embodiment of the present disclosure.

The corresponding graphs are shown in FIGS. 3 and 4 where RS stands for sheet resistance, RS U. stands for sheet resistance uniformity, and p.l. stands for pulse length. From these graphs it was observed that the lowest sheet resistance and the best uniformity was obtained for the following pulse sequence: $HfCl_4$ (4 s)/TMA (3 s). The resistivity of the obtained layer was about 20 mOhm.cm.

The sequence $HfCl_4$ (4 s)/TMA (3 s) was repeated until saturation at different temperatures in order to determine the temperature dependence of the growth per cycle (G. p. c.) (see FIG. 5).

The thickness was measured by x-ray reflectivity. From FIG. 5, it is clear that the growth per cycle strongly increases above 300° C. and is best around 370° C. This indicates a usable temperature window of from 250° C. to 500° C. However, we know from FIG. 2 that it is less advantageous to operate with a substrate above 370° C., due to TMA decomposition (CVD component). No reaction and therefore no material layer deposition were observed below 250° C.

Figure 5:
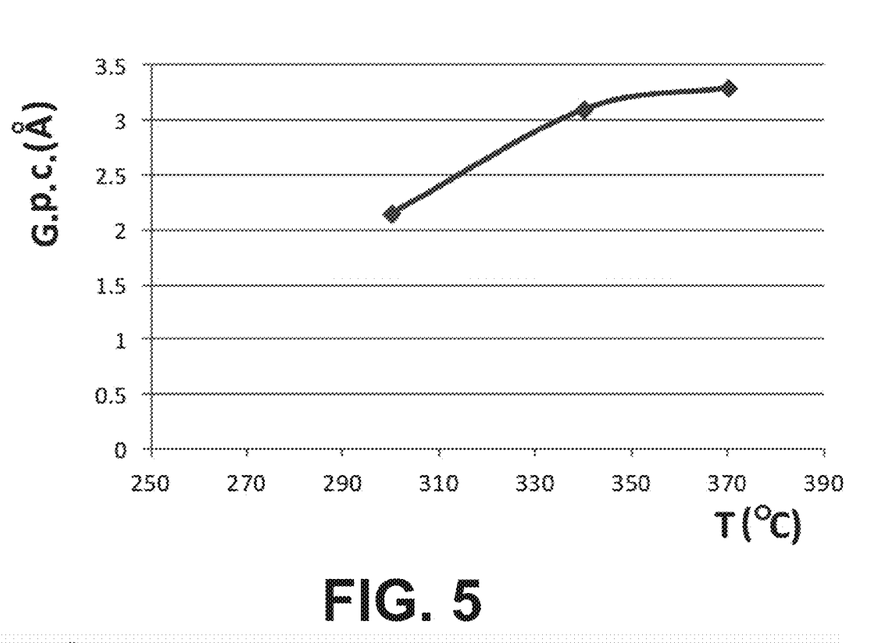
FIG. 5 shows the temperature dependency of the growth per cycle $HfCl_4$ (4 s)-purge-TMA (3 s)-purge according to an embodiment of the present disclosure.
Figure 6:
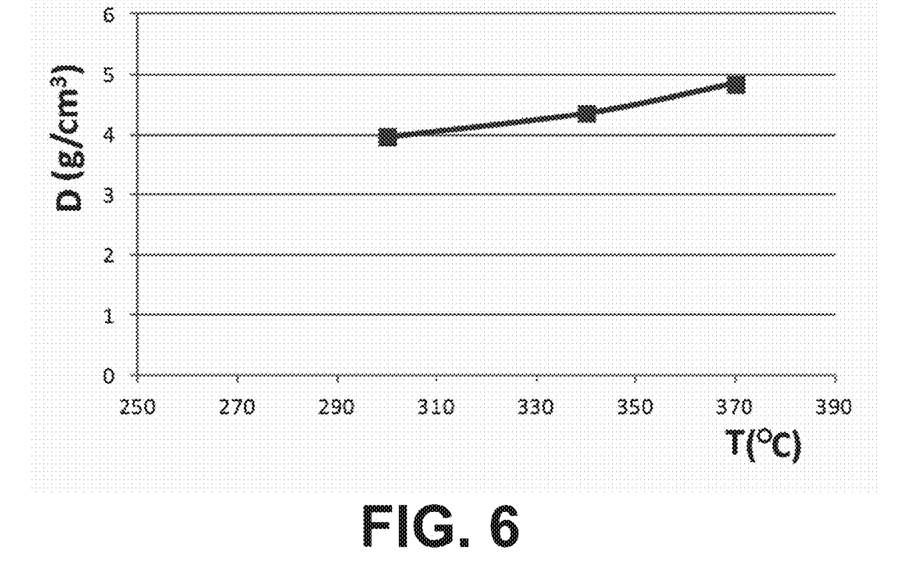
FIG. 6 shows the temperature dependency of the film density according to an embodiment of the present disclosure wherein a pulse sequence $HfCl_4$ (4 s)-purge-TMA (3 s)-purge is repeated until saturation.

The temperature dependency of the material layer density was measured by x-ray reflectivity (see FIG. 6) on the same samples used for establishing FIG. 5. It can be seen in FIG. 6 that a higher density is obtained at higher temperatures. The density remains however relatively low (4-5 g/cm$^3$ when compared to the bulk density (12.2 g/cm$^3$) of full crystalline HfC according to the literature.

Figure 10:
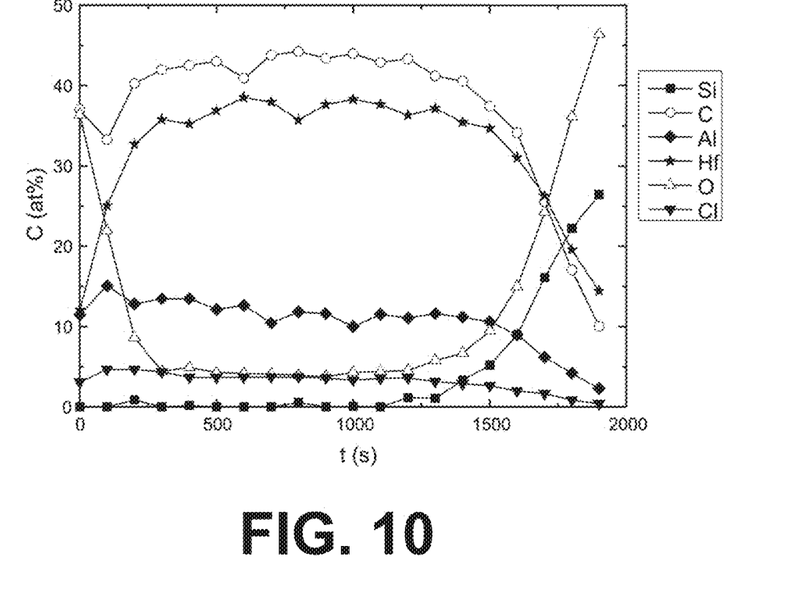
FIG. 10 shows the composition as determined by XPS for a material according to the first embodiment of the second aspect of the present disclosure for a deposition temperature of 370° C.
Figure 11:
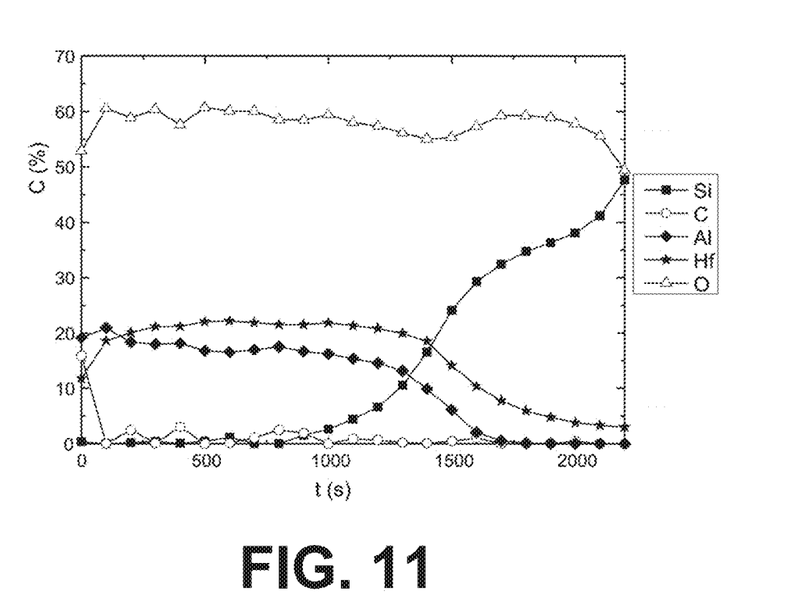
FIG. 11 shows the composition as determined by XPS for a material according to the second embodiment of the second aspect of the present disclosure for a deposition temperature of 370° C.
Figure 12:
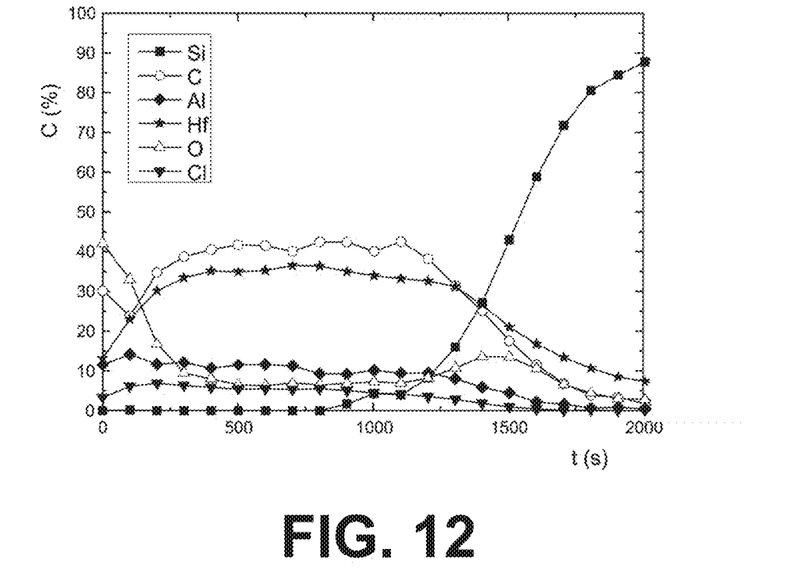
FIG. 12 shows the composition as determined by XPS for a material according to the first embodiment of the second aspect of the present disclosure for a deposition temperature of 340° C.
Figure 13:
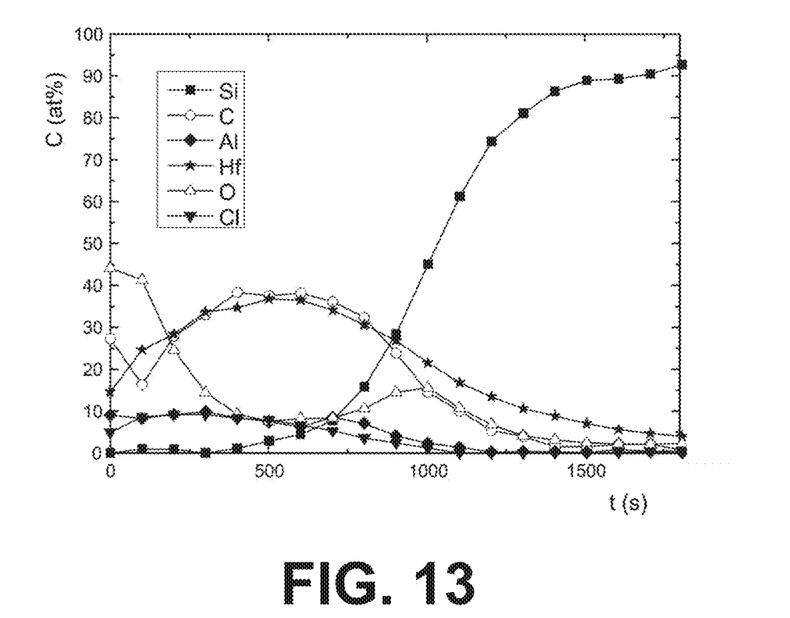
FIG. 13 shows the composition as determined by XPS for a material according to the first embodiment of the second aspect of the present disclosure for a deposition temperature of 370° C.

The composition of the HfC material layer at various depths was determined by alternating etching (via Ar sputtering) and XPS analysis. This has been performed at a deposition temperature of 300 (FIG. 13), 340 (FIG. 12), and 370° C. (FIG. 10). Peaks characteristics of Hf, C, Al, Cl and O were found. At the deposition temperature of 370° C., the bulk concentration of C was from 41 to 44 at % as measured by XPS. The bulk concentration of Hf was from 35 to 38 at % as measured by XPS. The bulk concentration of Al was from 10 to 13 at % as measured by XPS. The bulk concentration of O was from 4 to 5 at % as measured by XPS. The bulk concentration of Cl was from 3 to 4 at % as measured by XPS. At the deposition temperature of 340° C., the bulk concentration of C was from 40 to 43 at % as measured by XPS. The bulk concentration of Hf was from 33 to 37 at % as measured by XPS. The bulk concentration of Al was from 9 to 12 at % as measured by XPS. The bulk concentration of O was from 6 to 9 at % as measured by XPS. The bulk concentration of Cl was from 5 to 7 at % as measured by XPS. At the deposition temperature of 300° C., the bulk concentration of C was from 32 to 38 at % as measured by XPS. The bulk concentration of Hf was from 30 to 37 at % as measured by XPS. The bulk concentration of Al was from 6 to 10 at % as measured by XPS. The bulk concentration of O was from 7 to 14 at % as measured by XPS. The bulk concentration of Cl was from 3 to 9 at % as measured by XPS.

At each of these temperatures, the presence of the oxygen is believed to be due to the time the sample spent in the presence of air (30 min) before the XPS measurements. It can therefore in principle be reduced to zero.

Example 2

HfCO Process

The following pulse sequence was performed on a substrate at 370° C.: $HfCl_4$ (5 s)-$N_2$ purge-TMA (5 s)-$N_2$ purge-$H_2O$ (1 s)-$N_2$ purge.

Figure 7:
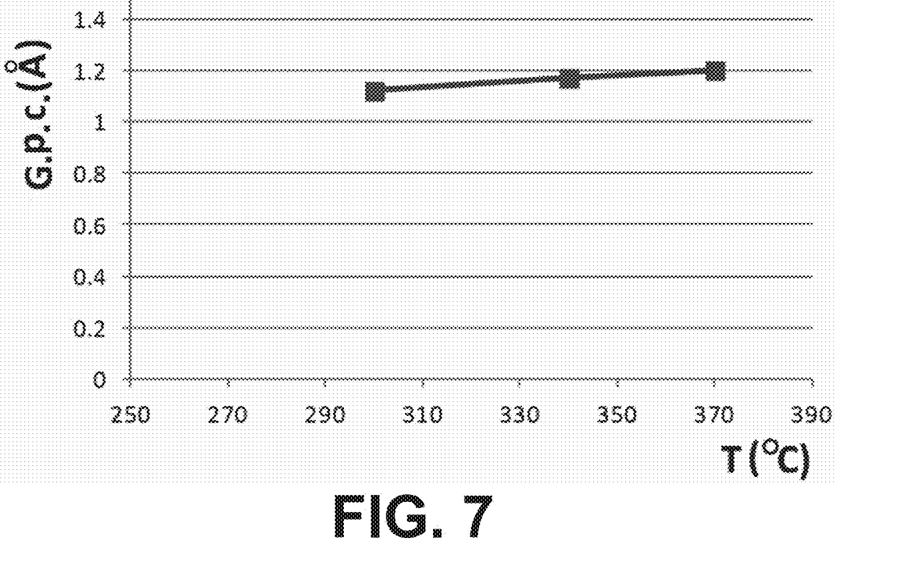
FIG. 7 shows the temperature dependency of the growth per cycle $HfCl_4$ (5 s)-purge-TMA (4 s)-purge-$H_2O$ (1 s) according to an embodiment of the present disclosure.

The sequence $HfCl_4$ (5 s)/TMA (5 s)/$H_2O$ (1 s)/was repeated at different temperatures in order to determine the temperature dependence of the growth per cycle (G. p. c.) (see FIG. 7).

The thickness was measured by x-ray reflectivity. From FIG. 7, it is clear that the growth per cycle is best around 370° C. This suggests a usable temperature window of from 250° C. to 500° C. However, we know from FIG. 2 that it is less advantageous to operate with a substrate above 370° C., due to TMA decomposition (CVD component). No reaction and therefore no material layer deposition were observed below 250° C.

Figure 8:
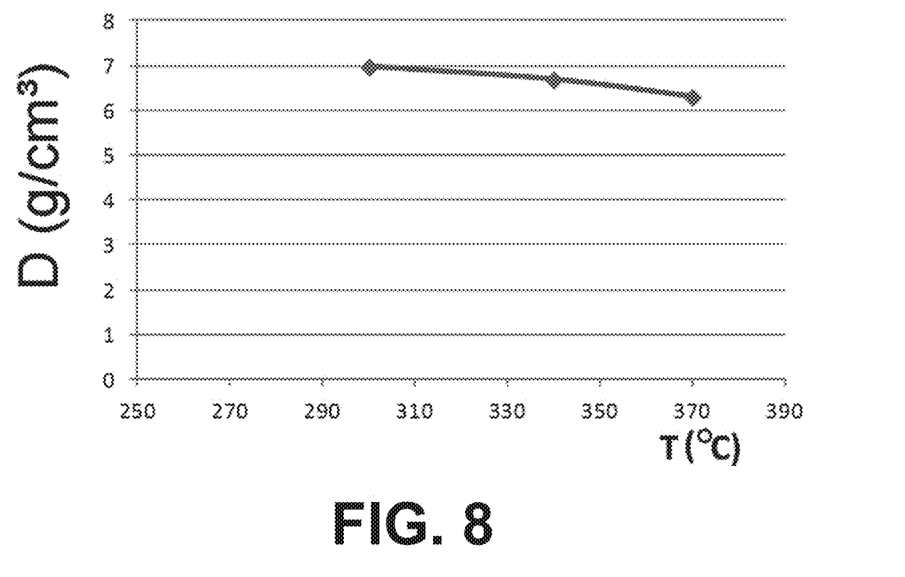
FIG. 8 shows the temperature dependency of the film density according to an embodiment of the present disclosure wherein a pulse sequence $HfCl_4$ (5 s)-purge-TMA (4 s)-purge-$H_2O$ (1 s) is followed.

The temperature dependency of the material layer density was measured by x-ray reflectivity (see FIG. 8). It can be seen in this figure that a the density decreases slowly between 300 and 370° C. The density remains however close to the expected bulk density. The expected bulk density is determined by an interpolation between bulk $Al_2O_3$ and $HfO_2$.

The composition of the HfCO material layer at various depths was determined by alternating etching (via Ar sputtering) and XPS analysis. Peaks characteristics of Hf, C, Al, and O were found. The bulk concentration of C was not determined because it was too close to the detection limit. The bulk concentration of Hf was from 18 to 23 at %. The bulk concentration of Al was from 16 to 21 at %. The bulk concentration of O was from 57 to 61 at %.

Figure 9A:
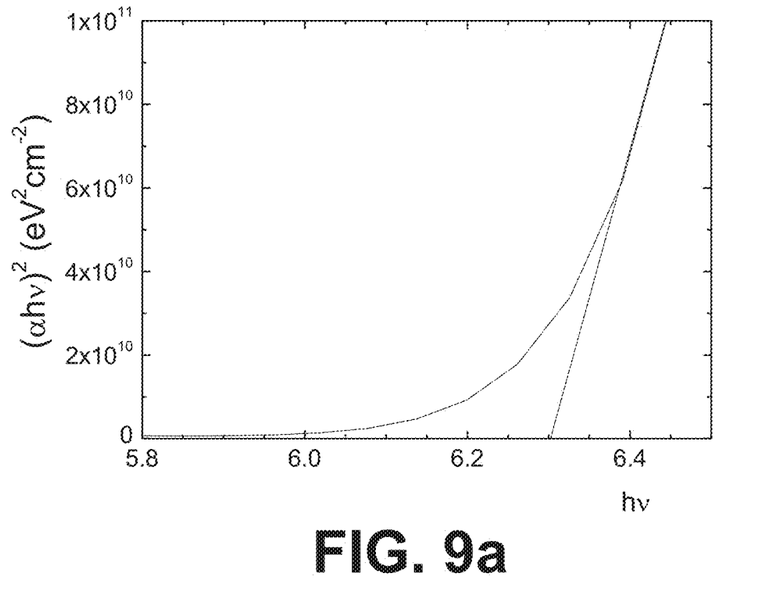
FIG. 9a shows the optical properties of a film produced according to an embodiment of the present disclosure wherein a pulse sequence $HfCl_4$ (5 s)-purge-TMA (4 s)-purge-$H_2O$ (1 s) is followed.

FIG. 9a shows the optical properties ((absorption*photon energy)$^2$ vs. photon energy) of the material obtained via a pulse sequence $HfCl_4$ (5 s)-purge-TMA (4 s)-purge-$H_2O$ (1 s)-purge.

The band gap can be calculated from the optical properties by a linear interpolation of the square of the absorption coefficient to zero. These properties show that the obtained material is a dielectric material having a band gap of 6.3 eV.

Figure 9B:
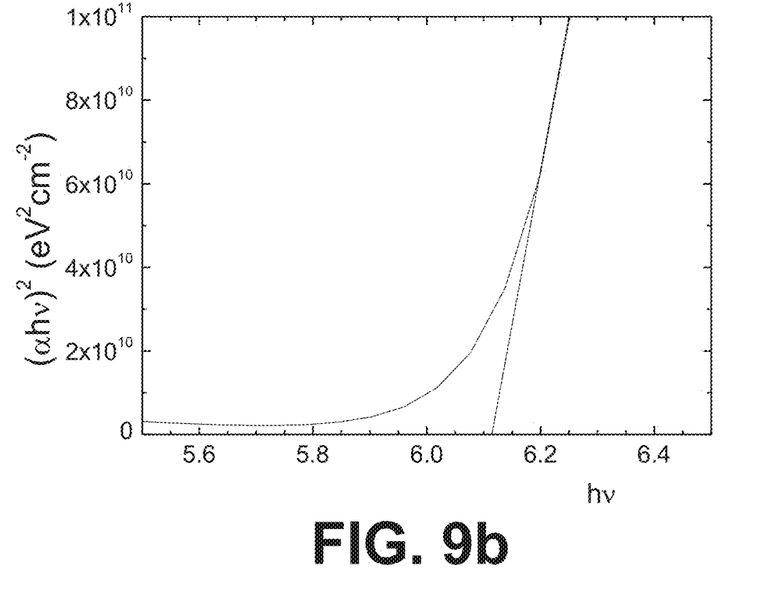
FIG. 9b shows the optical properties of a film produced according to an embodiment of the present disclosure wherein a pulse sequence $HfCl_4$ (5 s)-purge-TMA (4 s)-purge-$HfCl_4$ (5 s)-purge-$H_2O$ (1 s) is followed.

FIG. 9b shows the optical properties (absorption*photon energy)$^2$ vs. photon energy) of a material obtained via a pulse sequence $HfCl_4$ (5 s)-purge-TMA (4 s)-purge-$HfCl_4$ (5 s)-purge-H2O (1 s)-purge.

The band gap can be calculated from the optical properties by a linear interpolation of the square of the absorption coefficient to zero. These properties show that the obtained material is a dielectric material having a band gap similar of 6.1 eV.

Figure 14:
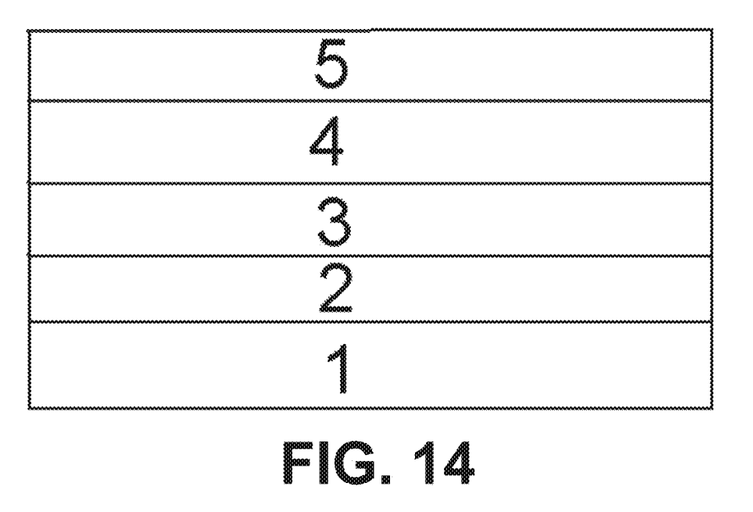
FIG. 14 is a schematic representation of a device according to an embodiment of the present disclosure.

FIG. 14 shows a device according to the fourth aspect of the present disclosure. It shows a substrate (1) on which a metal-insulator-metal stack is deposited, said stack comprising:

A first metal layer (2),
A layer of material according to any embodiment of the second or third aspect (3),
A $HfO_2$ layer (4), and
A second metal layer (5).

The invention claimed is:

1. A method for the manufacture of a layer of material over a substrate, said method comprising:
   a) providing a substrate, and
   b) depositing a layer of material on said substrate via atomic layer deposition (ALD) at a temperature of from 250 to 500° C., said depositing step comprising one or more deposition cycles, each said deposition cycle comprising:
      at least one $HfX_4$ pulse followed by a purge, and
      at least one trimethyl-aluminum (TMA) pulse followed by a purge, and
      a single oxidizer (Ox) pulse followed by a purge,
   wherein X is a halogen selected from Cl, Br and I, and wherein a $HfX_4$ pulse-purge sequence of each said deposition cycle is performed immediately before or immediately after a TMA pulse-purge sequence.

2. The method according to claim 1, wherein in each said deposition cycle, at least one of the $HfX_4$ pulse-purge sequences is immediately followed by one of the TMA pulse-purge sequences.

3. The method according to claim 1, wherein said single Ox pulse is selected from $H_2O$ and $O_3$ pulses.

4. The method according to claim 1, wherein each said deposition cycle comprises a sequence of pulses $HfX_4$/TMA/Oxidizer/.

5. The method according to claim 1, further comprising a step of providing a $HfO_2$ layer over or under said layer of material.

6. The method according to claim 5, wherein said $HfO_2$ layer is provided by a sequence of m cycles of pulses $HfX_4$/Oxidizer/, wherein m is from 1 to 100.

7. The method according to claim 1, wherein X is Cl.

8. The method according to claim 1, wherein said temperature is from 300 to 400° C.

9. The method according to claim 1, wherein the layer of material comprises the elements Hf, Al, O, and optionally C and X, wherein said elements Hf, Al, C, O and X make up at least 90 atom percent (at %) composition of the layer of material as determined by XPS, and wherein Hf represents from 17 to 23% of the total at % of said elements Hf, Al, C, O and X as measured by XPS;
Al represents from 16 to 23% of the total at % of said elements Hf, Al, C, O and X as measured by XPS;
O represents 57 to 62% of the total at % of said elements Hf, Al, C, O and X as measured by XPS;
C represents from 0 to 3% of the total at % of said elements Hf, Al, C, O and X as measured by XPS; and
X represents from 0 to 1% of the total at % of said elements Hf, Al, C, O and X as measured by XPS.

10. The method according to claim 9, wherein the layer of material comprises hydrogen atoms in an amount of 0-5 at % as measured by time-of-flight elastic recoil detection analysis.

11. The method according to claim 1, wherein each said deposition cycle consists of a $HfX_4$ pulse followed by a purge, a TMA pulse followed by purge, and an Ox pulse followed by a purge.

12. The method according to claim 1, wherein each said deposition cycle consists of a sequence of pulses selected from the group consisting of:
$HfX_4$/TMA/$HfX_4$/Oxidizer/, and
$HfX_4$/TMA/Oxidizer/.

13. The method according to claim 1, wherein said depositing step comprises a plurality of deposition cycles, each said deposition cycle comprising a sequence of pulses $HfX_4$/Oxidizer/TMA/.

* * * * *